(12) United States Patent
Batinica et al.

(10) Patent No.: US 11,587,962 B2
(45) Date of Patent: Feb. 21, 2023

(54) IMAGING SYSTEM INCLUDING ANALOG COMPRESSION FOR SIMULTANEOUS PULSE DETECTION AND IMAGING

(71) Applicant: RAYTHEON COMPANY, Waltham, MA (US)

(72) Inventors: Michael J. Batinica, Ventura, CA (US); Christian M. Boemler, Goleta, CA (US); Paul Bryant, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 394 days.

(21) Appl. No.: 16/929,620

(22) Filed: Jul. 15, 2020

(65) Prior Publication Data

US 2022/0020791 A1 Jan. 20, 2022

(51) Int. Cl.
*H01L 27/146* (2006.01)
*H04N 5/355* (2011.01)
*H04N 5/3745* (2011.01)
*H04N 5/369* (2011.01)

(52) U.S. Cl.
CPC ... *H01L 27/14609* (2013.01); *H04N 5/35518* (2013.01); *H04N 5/36965* (2018.08); *H04N 5/3745* (2013.01)

(58) Field of Classification Search
CPC .......... H01L 27/14609; H04N 5/35518; H04N 5/36965; H04N 5/3745
See application file for complete search history.

(56) References Cited

U.S. PATENT DOCUMENTS

| | | | | |
|---|---|---|---|---|
| 10,154,207 | B2* | 12/2018 | Lund | ................. H01L 27/14649 |
| 10,222,258 | B2* | 3/2019 | Lund | ..................... G01S 7/4804 |
| 10,516,843 | B2* | 12/2019 | Liobe | ................. H04N 5/37455 |
| 2003/0071196 | A1 | 4/2003 | Seitz | |
| 2003/0205663 | A1* | 11/2003 | Boubal | ............. H01L 27/14609 |
| | | | | 250/214.1 |

(Continued)

FOREIGN PATENT DOCUMENTS

| | | |
|---|---|---|
| EP | 3291537 A1 | 3/2018 |
| WO | 2009136285 A2 | 11/2009 |

OTHER PUBLICATIONS

Internet Search Report and Written Opinion issued in PCT Application No. PCT/US2021/041551; Application Filing Date Jul. 14, 2021; dated Oct. 7, 2021 (12 pages).

(Continued)

*Primary Examiner* — Shahbaz Nazrul
(74) *Attorney, Agent, or Firm* — Cantor Colburn LLP

(57) ABSTRACT

An imaging system includes a light sensor, a pulse detection imaging (PDI) circuit, and an image processing unit. The light sensor generates one or both of an image signal and a pulse signal. The pulse PDI circuit includes a first terminal in signal communication with the light sensor to receive one or both of the image signal and the pulse signal and a second terminal in signal communication with a voltage source. The image processing unit is in signal communication with the PDI circuit to receive one or both of the image signal and the pulse signal and to simultaneously perform imagery and pulse detection based on the image signal and the pulse signal, respectively.

17 Claims, 4 Drawing Sheets

(56) References Cited

U.S. PATENT DOCUMENTS

| | | | |
|---|---|---|---|
| 2009/0051798 A1* | 2/2009 | Takayanagi | H04N 3/155 |
| | | | 348/308 |
| 2012/0248288 A1 | 10/2012 | Linder et al. | |
| 2019/0113605 A1* | 4/2019 | Liobe | G01S 17/894 |
| 2019/0204160 A1* | 7/2019 | Simolon | H04N 5/3745 |
| 2020/0150160 A1* | 5/2020 | Schlesselmann | G01R 19/25 |

OTHER PUBLICATIONS

Instruments, Texas "AN-311 Theory and Applications of Logarithmic Amplifiers" Application Report—SNOA575B; Apr. 1991 (Revised Apr. 2013) pp. 1-10.

Pini, A. "The Fundamentals of Logarithmic Amplifiers and How They Handle Wide Dynamic Range Signals" Digi-Key Electronics <URL: https://www.digikey.com/en/articles/the-fundamentals-of-logarithmic-amplifiers> Mar. 21, 2019 (7 pages).

* cited by examiner

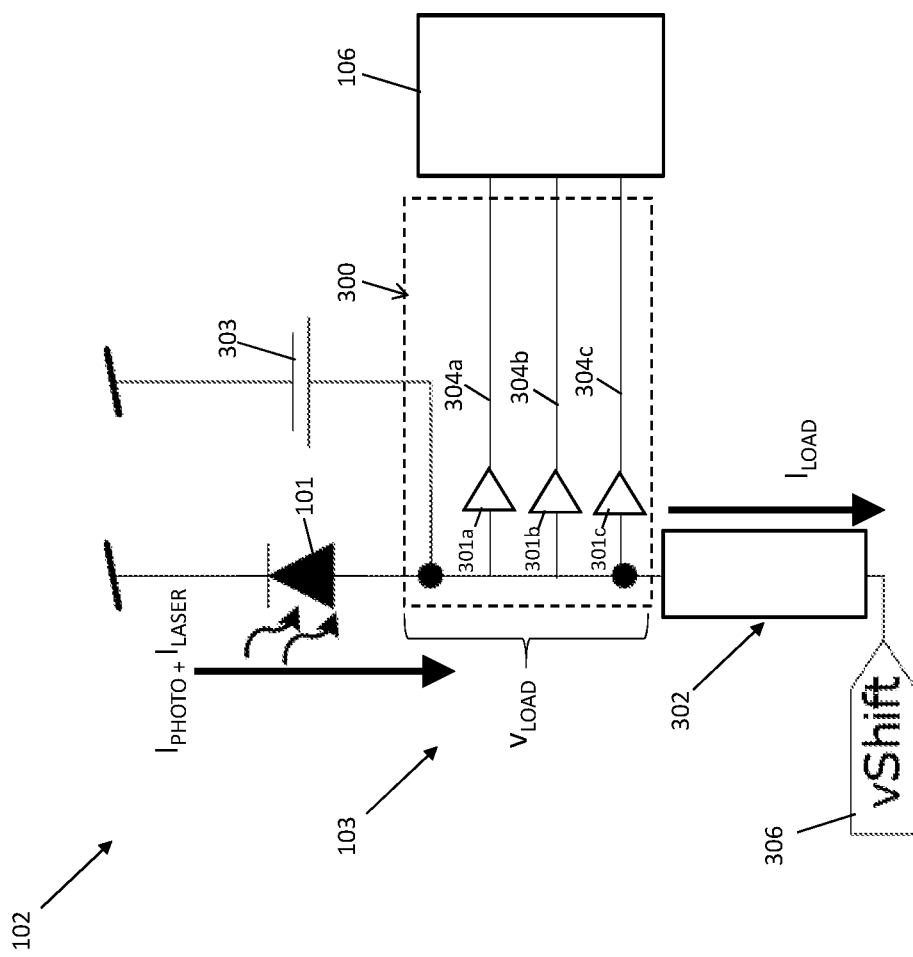

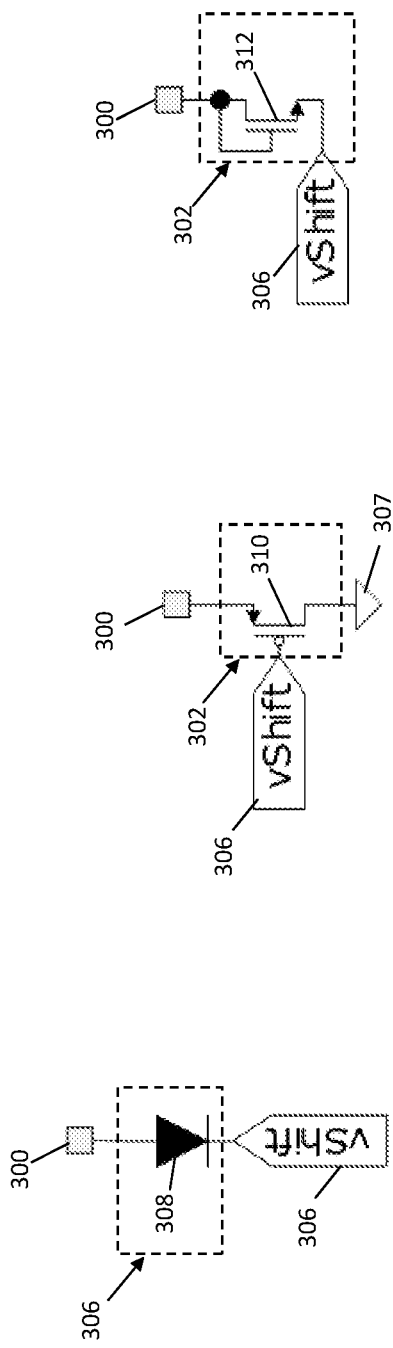

IMAGING SYSTEM INCLUDING ANALOG COMPRESSION FOR SIMULTANEOUS PULSE DETECTION AND IMAGING

BACKGROUND

The present disclosure relates to imaging system, and more particularly, to high spatial resolution (HSR) imaging systems.

High spatial resolution imaging systems are capable of distinguishing between objects or targets that are located within a small proximity to each other. HSR imaging systems are known to have the capability to detect energy pulses along with images. HSR imaging systems commonly operate in two separate modes. A first mode operates to detect the low resolution energy pulses, while a second mode operates to provide high-resolution imagery.

SUMMARY

According to a non-limiting embodiment an imaging system includes a light sensor, a pulse detection imaging (PDI) circuit, and an image processing unit. The light sensor generates one or both of an image signal and a pulse signal. The pulse PDI circuit includes a first terminal in signal communication with the light sensor to receive one or both of the image signal and the pulse signal and a second terminal in signal communication with a voltage source. The image processing unit is in signal communication with the PDI circuit to receive one or both of the image signal and the pulse signal and to simultaneously perform imagery and pulse detection based on the image signal and the pulse signal, respectively.

According to yet another non-limiting embodiment, a pulse detection imaging (PDI) circuit comprises a light sensor and at least one buffer that includes buffer input in signal communication with the light sensor. The PDI circuit further includes a passive load having a first load terminal in signal communication with the buffer input and a second load terminal in signal communication with a voltage source.

According to still another non-limiting embodiment, a method is provided to simultaneously perform pulse detection and imagery. The method comprises generating, via a light sensor, an image signal and a pulse signal; and compressing, via a pulse detection imaging (PDI) circuit, the image signal and the pulse signal. The method further comprises synchronously outputting the compressed image signal, while asynchronously outputting the compressed pulse signal to an image processing unit. The method further comprises simultaneously processing, via the image processing unit, the compressed pulse signal to detect an energy pulse and the compressed image signal to generate an image.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIG. 3 is a schematic diagram of an image detector including a PDI circuit according to a non-limiting embodiment; and FIGS. 4A-4E illustrate schematics of various passive loads that can be included in the PDI circuit shown in FIG. 3 according to non-limiting embodiments.

DETAILED DESCRIPTION

As mentioned above, known HSR imaging systems capable of providing both energy pulse detection and high-resolution imagery typically operate in two selectable or simultaneous modes. In this arrangement, the first mode operates according to high frame rates 100 KHz to detect extremely fast or sudden events such as pulsed light (e.g. laser) or light flashes. The system or device can be switched to the second mode, which operates according to variable frame rates (e.g., 60 hertz) to provide the high-resolution imagery. However, conventional HSR imaging systems and imaging devices implementing the same do not simultaneously perform both energy pulse detection and high-resolution imagery. Therefore, mode of the conventional HSR imaging system must be programmed or switched (e.g., manually) to adjust the attenuation at particular times to process both small and large laser pulses to detect energy pulses and high-resolution images, respectively. However, the need to switch to the appropriate mode can result in missed opportunities to achieve the desired process, i.e., detection of an energy pulse or generation of a high-resolution image.

Various embodiments described solve the problems of the prior art by providing a ROIC including a pulse detection and imagery (PDI) circuit that facilitates simultaneous energy pulse detection and high-resolution imagery. The PDI circuit implements a non-linear passive load and exploits the non-linear response of the load to perform compression on the signal provided by the light sensor (e.g., photodiode). In addition, the PDI circuit includes individual signal paths dedicated to energy pulse detection and high-resolution imagery. Accordingly, an image processing unit can asynchronously processes a signal corresponding to an energy pulse and synchronously process a signal corresponding to high-resolution imagery and process both signals simultaneously. In this manner, an HSR imaging system is provided that simultaneously performs energy pulse detection and high-resolution imagery.

Figure 1:
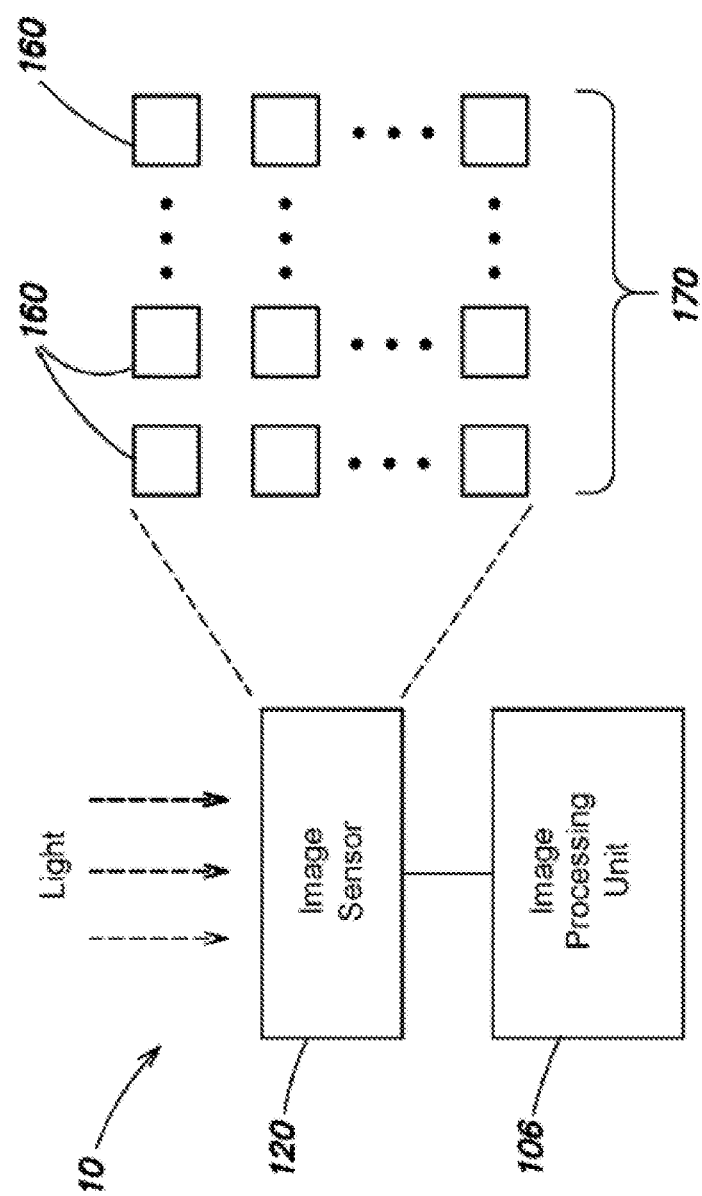
FIG. 1 is a block diagram illustrating an image capture device according to a non-limiting embodiment.

Turning now to FIG. 1, a block diagram illustrating an image capture device 10 that may be used to capture images according to aspects described herein. For example, device 10 may be a digital camera, video camera, or other photographic and/or image capturing equipment. Image capture device 10 comprises an image sensor 120 and an image processing unit 106. The image sensor 120 may be an Active Pixel Sensor (APS) or other suitable light sensing device that can capture images. The image processing unit 106 may be a combination of hardware, software, and/or firmware that is operable to receive signal information from the image sensor 120 and convert the signal information into a digital image. In one or more embodiments, the image processing unit 106 includes a field programmable gate array (FPGA) capable of processing one or more signals generated by the image sensor 120. The image sensor 120 includes an array 170 of unit cells 160. Each unit cell 160 accumulates charge proportional to the light intensity at that location in the field of view and provides an indication of the intensity of light at that location to the image processing unit 106. Each unit cell 160 may correspond to a pixel in the captured electronic image.

Figure 2:
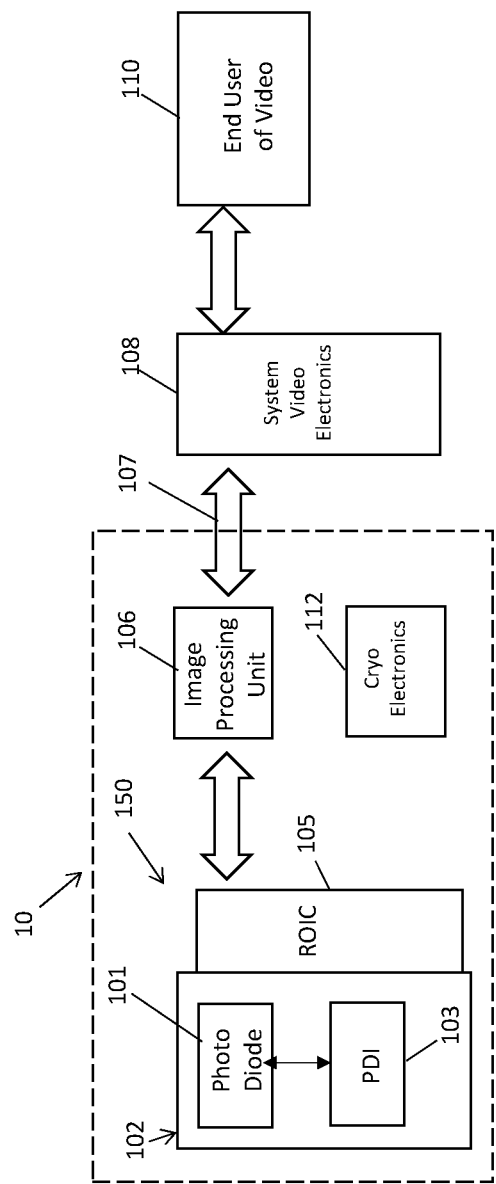
FIG. 2 is a block diagram illustrating a digital unit cell including a digital read output integrated circuit (ROIC) according to a non-limiting embodiment.

Turning to FIG. 2, a block diagram illustrating a digital pixel circuit 100 according to aspects described herein. The digital pixel circuit 100 includes a unit cell 160 in signal communication with an image processing unit 106. The unit cell 160 includes an image detector 102 and a ROIC 105.

The image detector 102 includes a light sensor 101 and a PDI circuit 103. The image detector 102 is coupled to a corresponding digital read output integrated circuit (ROIC) 105. In one or more embodiments, the light sensor 101 includes, for example, a photodiode array 101. The ROIC 105 is coupled to the image processing unit 106. Although the ROIC 105 and the imaging processing unit 106 are shown as separate components, it should be appreciated that other embodiments allow for a ROIC 105 that can perform the functions of the image processing unit 106 described above.

The PDI circuit 103 facilitates simultaneous energy pulse detection and high-resolution imagery. In one or more non-limiting embodiments, the PDI circuit 103 implements a non-linear passive load. The non-linear behavior of the passive load is exploited to perform compression on one or more signals provided by the light sensor (e.g., photodiode). The compressed signals are then processed by the image processing unit 106 to simultaneously perform energy pulse detection and high-definition imagery as described in greater detail below.

The image processing unit 106 is also coupled to an external system video electronics module 108 via an interface 107. According to at least one embodiment, the digital pixel circuit 100 also includes a cryo-electronics module 112 that is configured to control the temperature of the ROIC 105. In other embodiments, however, the cryo-electronics module 112 may not be included.

Turning to FIG. 3, an image detector 102 including a PDI circuit 103 configured to simultaneously perform energy pulse detection and high-definition imagery is described accorded to a non-limiting embodiment. The PDI circuit 103 includes one or more buffers 300, a passive load 302, and a capacitor 303. The PDI circuit 103 is in signal communication with a light sensor 101 such as, for example, a photodiode 101. The capacitor 303 is connected in parallel with the light sensor and facilitates signal decay as described in greater detail below.

The PDI circuit 103 has a logarithmic behavior in response to receiving a DC photocurrent and has an integration behavior in response to an AC laser current. In one or more embodiments the DC photocurrent is generated in response to a persistent emission or reflection of energy from an object, while an AC laser current is generated in response to a brief pulse (e.g., 15 ns to 100 ms) of energy. In this manner, the PDI circuit 103 is capable of amplifying faint signal levels while attenuating or "compressing" bright signal levels into the operating voltage range of the unit cell. Accordingly, the image detector 102 can detect faint imaging signals while simultaneously being ready for arrival of very high-intensity laser return spots. The DC response of an image signal applied to the PDI circuit 103 can be described as follows:

$$\text{DC response: } VLoad = nVt \ln\left(\frac{IPhoto}{Is} + 1\right) \quad \text{Eq. 1}$$

An AC laser current (e.g., pulse signal) flowing through the PDI circuit 103 does not necessarily equilibrate immediately. AC laser current associated with smaller laser pulses flowing through the PDI circuit 103 integrate across the capacitor 303 immediately or substantially immediately. AC laser current associated with larger AC laser pulses, however, do not integrate immediately. Larger laser pulses can have a larger magnitude or larger number of photons compared to a smaller laser pulse. As a result, the larger laser pulse integrates first, and then decays due to the passive load, thereby effectively producing a negative feedback. In this manner, the PDI circuit 103 can compress the fast pulse signal to detect small or large laser pulses. The AC response of a pulse signal applied to the PDI circuit 103 can be described as follows:

$$\text{AC response: } VLoad = \frac{1}{C}\int IPhoto + ILaser - Is\left(\exp^{\left(\frac{VLoad}{nVt}\right)} - 1\right)dt, \quad \text{Eq. 2}$$

where:

Iphoto is the constant or persistent emission or reflection of energy received from an imaged object; and Ilaser is the received photocurrent from the energy impinging on the light sensor 101.

Eq. 2 described above indicates the speed at which a laser pulse causes an increase in the Vload voltage due to integration on the capacitor 303 until the elevated voltage causes a current to flow back through the photodiode 101 and work to drain off the laser pulse surge. Both small and large laser pulses cause an immediate increase in the Vload voltage. However, a large laser pulse engages the photodiode 101 quicker to prevent saturation (i.e., saturating the ROIC). In this manner, the image detector 102 described herein does not require any programmable or manual attenuation, but rather automatically adapts to both small and large laser pulses. Accordingly, the image detector 102 can facilitate automatic detection of energy pulses and high-resolution images simultaneously.

The buffers 300 can include, but are not limited to, a first buffer 301a, a second buffer 301b, and a third buffer 301c. Each buffer 301a, 301b, 301c includes a buffer input in signal communication with a light sensor 101. The first buffer 301a includes a first buffer output in signal communication with the image processing unit 106. Accordingly, the first buffer 301a establishes an imaging signal path 304a configured to deliver a first signal (e.g., a high-resolution image signal) to the image processing unit 106. The second buffer 301b includes a second buffer output in signal communication with the image processing unit 106. Accordingly, the second buffer 301b establishes a pulse shape sampling signal path 304b configured to deliver a second signal (e.g., a pulse shape sampling signal) to the image processing unit 106. The third buffer 301c includes a third buffer output in signal communication with the image processing unit 106. Accordingly, the third buffer 301c establishes a pulse detection signal path 304c configured to deliver a third signal (e.g., a laser pulse detection signal) to the image processing unit 106.

The passive load 302 operates according to a non-linear behavior. The passive load 302 includes a first load terminal in signal communication with the buffer 300 (e.g., the buffer input of one or more of the buffers 301a, 301b, 301c) and a second load terminal in signal communication with a voltage source (vSHIFT) 306. In one or more embodiments, the voltage source 306 prevents an excessive voltage drop (Vt) across the load (e.g., diode 308) to improve the precision of Vload. In one or more embodiments, the voltage source 306 can overcome a voltage drop (Vt) across the load (e.g., a Vt drop on the source terminal). For example, source followers will have a gate voltage (Vgs) voltage of about 0.8 V, thereby requiring the gate voltage to be kept at greater than 0.8V to prevent amplifier clipping. The Vshift adds a fixed offset to the Vload voltage to ensure that the source follower and current mirror load is in saturation and not clipping the signal.

FIGS. 4A-4E illustrate various examples that can be employed in the PDI circuit 103. FIG. 4A illustrates an example where the passive load 302 is implemented as a diode 308. The diode 308 has an anode connected to the buffer 300 (e.g., the buffer input of one or more of the buffers 301a, 301b, 301c) and a cathode connected to the voltage source 306.

FIG. 4B illustrates an example where the passive load 302 is implemented as a p-channel MOSFET 310. The p-channel MOSFET 310 has a source connected to the buffer 300 (e.g., the buffer input of one or more of the buffers 301a, 301b, 301c), a drain connected to a ground protentional 307, and a gate connected to the voltage source 306.

FIG. 4C illustrates an example where the passive load 302 is implemented as an n-channel MOSFET 312. The n-channel MOSFET 312 has a drain connected to the buffer 300 (e.g., the buffer input of one or more of the buffers 301a, 301b, 301c), a source connected to the voltage source 306, and a gate connected to the drain and the buffer 300 (e.g., the buffer input of one or more of the buffers 301a, 301b, 301c).

FIG. 4D illustrates an example where the passive load 302 is implemented as an NPN bipolar junction transistor 314. The transistor 314 has a collector connected to the buffer 300 (e.g., the buffer input of one or more of the buffers 301a, 301b, 301c), an emitter connected to the voltage source 306, and a base connected to the collector and the buffer 300 (e.g., the buffer input of one or more of the buffers 301a, 301b, 301c).

FIG. 4E illustrates an example where the passive load 306 includes a PNP bipolar junction transistor 316. The transistor in this example has an emitter connected to the buffer 300 (e.g., the buffer input of one or more of the buffers 301a, 301b, 301c), a collector connected to a ground potential 307, and a base connected to the voltage source 306.

As described herein, one or more embodiments provide an imaging system that includes a pulse detection and imagery (PDI) circuit capable of facilitating simultaneous energy pulse detection and high-resolution imagery. The PDI circuit implements a non-linear passive load and exploits the non-linear response of the load to perform compression on the signal provided by the light sensor (e.g., photodiode). In addition, the PDI circuit includes individual signal paths dedicated to energy pulse detection and high-resolution imagery. Accordingly, an image processing unit can asynchronously process a signal corresponding to an energy pulse and asynchronously process a signal corresponding to high-resolution imagery and process both signals simultaneously. In this manner, an HSR imaging system is provided that simultaneously performs energy pulse detection and high-resolution imagery.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

As used herein, the term "module" refers to an application specific integrated circuit (ASIC), an electronic circuit, a microprocessor, a computer processor (shared, dedicated, or group) and memory that executes one or more software or firmware programs, a combinational logic circuit, a microcontroller including various inputs and outputs, and/or other suitable components that provide the described functionality. The module is configured to execute various algorithms, transforms, and/or logical processes to generate one or more signals of controlling a component or system. When implemented in software, a module can be embodied in memory as a non-transitory machine-readable storage medium readable by a processing circuit (e.g., a microprocessor) and storing instructions for execution by the processing circuit for performing a method. A controller refers to an electronic hardware controller including a storage unit capable of storing algorithms, logic or computer executable instruction, and that contains the circuitry necessary to interpret and execute instructions.

A module can also be established as logic embodied in hardware or firmware, or to a collection of computer readable software instructions, written in a programming language including, but not limited to, VHDL, Verilog, Java, C, or assembly, and which is executed by one or more electronic microprocessors. One or more software instructions in the modules may be embedded in firmware, such as, for example, in an EPROM, and/or stored in any type of non-transitory computer-readable medium or other storage device.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. An imaging system comprising:
a light sensor configured to generate one or both of an image signal and a pulse signal;
a pulse detection imaging (PDI) circuit including a first terminal in signal communication with the light sensor to receive one or both of the image signal and the pulse signal and a second terminal in signal communication with a voltage source; and
an image processing unit in signal communication with the PDI circuit to receive one or both of the image signal and the pulse signal and to simultaneously perform imagery and pulse detection based on the image signal and the pulse signal, respectively,
wherein the PDI circuit further comprises:
a plurality of buffers, each buffer including a buffer input in signal communication with the light sensor and each buffer establishing a respective signal path to asynchronously deliver one or both of the image signal and the pulse signal to the image processing unit; and a passive load including a first load terminal in signal communication with the buffer input and a second load terminal in signal communication with the voltage source.

2. The imaging system of claim 1, wherein the plurality of buffers comprises a first buffer including a first buffer input in signal communication with the light sensor and a first buffer output in signal communication with the image processing unit to deliver an imaging signal based at least in part on the image signal to the image processing unit.

3. The imaging system of claim 1, wherein the plurality of buffers comprises a second buffer including a second buffer input in signal communication with the light sensor and a second buffer output in signal communication with the image processing unit to deliver a pulse shape sampling signal based at least in part on the pulse signal to the image processing unit.

4. The imaging system of claim 1, wherein the plurality of buffers comprises a third buffer including a third buffer input in signal communication with the light sensor and a third buffer output in signal communication with the image processing unit to deliver a pulse detection signal based at least in part on the pulse signal to the image processing unit.

5. The imaging system of claim 1, wherein the passive load is a non-linear passive load including at least one of a diode, a p-channel MOSFET, a n-channel MOSFET, an NPN bipolar junction transistor, and a PNP bipolar junction transistor.

6. A pulse detection imaging (PDI) circuit comprising:
a light sensor;
at least one buffer including a buffer input in signal communication with the light sensor; and
a passive load including a first load terminal in signal communication with the buffer input and a second load terminal in signal communication with a voltage source,
wherein the at least one buffer includes a plurality of buffers, each buffer establishing a respective signal path to asynchronously deliver a signal generated by the image sensor to an image processing unit.

7. The PDI circuit of claim 6, wherein the plurality of buffers comprises a first buffer including a first buffer input in signal communication with the light sensor and a first buffer output in signal communication with the image processing unit to deliver an imaging signal to the image processing unit.

8. The PDI circuit of claim 6, wherein the plurality of buffers comprises a second buffer including a second buffer input in signal communication with the light sensor and a second buffer output in signal communication with the image processing unit to deliver a pulse shape sampling signal to the image processing unit.

9. The PDI circuit of claim 6, wherein the plurality of buffers comprises a third buffer including a third buffer input in signal communication with the light sensor and a third buffer output in signal communication with the image processing unit to deliver a pulse detection signal to the image processing unit.

10. The PDI circuit of claim 6, wherein the passive load includes a diode having an anode connected to the buffer input and a cathode connected to the voltage source.

11. The PDI circuit of claim 6, wherein the passive load includes a p-channel MOSFET having a source connected to the buffer input, a drain connected to a ground protentional, and a gate connected to the voltage source.

12. The PDI circuit of claim 6, wherein the passive load includes a n-channel MOSFET having a drain connected to the buffer input, a source connected to the voltage source, and a gate connected to the drain and the buffer input.

13. The PDI circuit of claim 6, wherein the passive load includes an NPN bipolar junction transistor having a collector connected to the buffer input, an emitter connected to the voltage source, and a base connected to the collector and the buffer input.

14. The PDI circuit of claim 6, wherein the passive load includes a PNP bipolar junction transistor having an emitter connected to the buffer input, a collector connected to a ground potential, and a base connected to the voltage source.

15. A method of simultaneously performing pulse detection and imagery, the method comprising:
generating, via a light sensor, an image signal and a pulse signal;
compressing, via a pulse detection imaging (PDI) circuit, the image signal and the pulse signal;
synchronously outputting the compressed image signal to an image processing signal via a first buffer including a first buffer input in signal communication with the light sensor to establish a first signal path to deliver the compressed image signal to the image processing unit, while asynchronously outputting the compressed pulse signal to the image processing unit via a second buffer including a second buffer input in signal communication with the light sensor to establish a second signal path to deliver the compressed pulse signal to the image processing unit; and
simultaneously processing, via the image processing unit, the compressed pulse signal to detect an energy pulse and the compressed image signal to generate an image.

16. The method of claim 15, further comprising:
delivering the image signal to the image processing unit; and
delivering the pulse signal to the image processing unit independently from the image signal.

17. The method of claim 16,
wherein the first signal path is different and separate from the second signal path.

* * * * *